United States Patent [19]
Paff

[11] Patent Number: 5,006,824
[45] Date of Patent: Apr. 9, 1991

[54] THIRD MODE TORSIONAL F-M RESONATOR

[75] Inventor: Aaron R. Paff, Tustin, Calif.

[73] Assignee: Rockwell International Corporation, El Segundo, Calif.

[21] Appl. No.: 849,093

[22] Filed: Apr. 7, 1986

[51] Int. Cl.⁵ ............................................. H03H 9/205
[52] U.S. Cl. .................................. 333/197; 333/198; 310/321; 310/333; 310/367
[58] Field of Search ............................. 333/186–192, 333/198, 199; 310/311, 316, 318, 320, 321, 333, 334, 367, 369

[56] References Cited

U.S. PATENT DOCUMENTS

| | | | |
|---|---|---|---|
| 2,895,061 | 7/1959 | Probus | 310/311 |
| 3,376,521 | 4/1968 | Traub | 333/186 |
| 3,471,645 | 10/1969 | Werther et al. | 333/186 X |
| 3,842,294 | 10/1974 | Doi et al. | 333/186 X |
| 3,931,600 | 1/1976 | Nagashima et al. | 310/321 X |
| 3,983,516 | 9/1976 | Johnson | 333/198 |
| 4,241,321 | 12/1980 | Kasai et al. | 333/186 X |
| 4,281,298 | 7/1981 | Gounji et al. | 333/186 |
| 4,314,216 | 2/1982 | Gounji et al. | 333/198 |
| 4,327,341 | 4/1982 | Ernyei | 333/186 X |
| 4,553,060 | 11/1985 | Domino et al. | 310/321 X |
| 4,555,682 | 11/1985 | Gounji et al. | 333/186 X |

FOREIGN PATENT DOCUMENTS

| | | | |
|---|---|---|---|
| 0009344 | 1/1977 | Japan | 333/198 |
| 0038743 | 3/1980 | Japan | 333/198 |
| 0038744 | 3/1980 | Japan | 333/198 |
| 0079724 | 5/1982 | Japan | 333/186 |

Primary Examiner—Eugene R. LaRoche
Assistant Examiner—Seung Ham
Attorney, Agent, or Firm—H. Fredrick Hamann; George A. Montanye; David J. Arthur

[57] ABSTRACT

There is disclosed an improved electromechanical resonator for use in multiresonator mechanical bandpass filters. The resonator is constructed using two resonator rods attached to a ceramic transducer which is substantially centrally located. The thus-formed electromechanical resonator resonates at the desired frequency in the third torsional mode, which is characterized by three motional nodes. Support pins are attached at the two outer nodes to provide physical support, and are also used for signal and ground connections, while the ceramic is positioned on or near the center node, which maximizes the achievable electromechanical coupling. Multiresonator mechanical bandpass filters which use such third-mode electromechanical resonators in conjunction with second-mode interior resonators have improved spurious rejection.

6 Claims, 2 Drawing Sheets

THIRD MODE TORSIONAL F-M RESONATOR

BACKGROUND OF THE INVENTION

The present invention is generally related to electromechanical filters and more specifically, is related to electromechanical resonators used as input and output transducers in multiresonator bandpass mechanical filters. The present invention is even more specifically related to instances where the electromechanical resonators need to operate in a torsional mode.

In the prior art, electromechanical resonators are used to convert electrical signals into numerous modes of vibration including flexure, torsion and extension, and to convert mechanical energy into electrical energy. In mechanical filters, an input electromechanical resonator is acoustically coupled to mechanical resonators in the interior of a filter, and which, in turn, are coupled to an output electromechanical resonator to form a bandpass filter. Such mechanical bandpass filters formed by the combination of electromechanical resonators and one or more mechanical resonators have a wide variety of uses in conventional communication systems including telephone, radio and avionics applications.

In such prior art systems, advances in technology demand miniaturization of various electronic components and systems. In an effort to miniaturize, some prior art attempts have employed torsional interior resonators in connection with mechanical bandpass filters in the 400-600 kHz range. To meet the requirements for a rugged construction second-mode torsional interior resonators are preferred, because second-mode torsional resonators possess two nodes to which supports can be attached. In such mechanical filters using torsional interior resonators, the selection of a torsional electromechanical resonator as the electromechanical resonator for the input and output of the filter is natural.

Typically, torsional electromechanical resonators include the use of resonator rods in conjunction with a commercially available ceramic transducer. In some instances, the resonator support pin and lead wire arrangement is insufficient to meet the rugged construction requirements and has insufficient versatility to produce sufficient electromechanical coupling required for many bandpass filters. The lead wire attachment to the ceramic disc or rod also increases costs and causes undesirable frequency variations.

In still other instances, second-mode torsional electromechanical resonators have been constructed using twin lead supports, for conducting the electrical signals into the resonator in lieu of the lead wire attachment to the ceramic disc. While this design provides a more rugged construction for use in mechanical filters, there is still insufficient electromechanical coupling for many mechanical bandpass filter configurations. Such limitations result from the need for maximum coupling, which can only be achieved by locating the ceramic transducer at one of the locations of maximum stress, which are, in fact, the nodes, which are the positions used to physically support the electromechanical resonator. Furthermore, spurious mode frequencies of the second-mode electromechanical resonator are close to those of the second-mode torsional interior resonators because of similar lengths, thereby allowing spurious frequencies to be passed by the filter. Each of these drawbacks limit use to which the electromechanical resonators may be applied in forming mechanical bandpass filters.

Accordingly, the present invention has been developed to provide an improved torsional electromechanical resonator which may be used to produce improved construction, coupling and spurious rejection in a miniaturized mechanical bandpass filter.

SUMMARY OF THE INVENTION

In accordance with the present invention, a torsional electromechanical resonator is constructed using resonator rods coupled to a ceramic disc to produce a three-mode torsional electromechanical resonator. The construction includes two resonator rods attached to an intermediate ceramic transducer and supported by support pins which are also used to conduct the electrical signal to the transducer. The support pins are centered at the two outside modes formed on the resonator rods. Depending on the relative lengths of the resonator rods, the ceramic transducer may be positioned anywhere in-between the two outer nodes, with the greatest electromechanical coupling occurring when the ceramic transducer is located on center, in line with the center node. The total length of the electromechanical resonator significantly different from the length of the second-mode resonators, thereby providing spurious rejection of signals in a mechanical bandpass filter using second-mode interior resonators.

It is therefore a feature of the invention to provide an improved electromechanical resonator.

It is a further feature of the invention to provide an electromechanical resonator with improved electromechanical coupling for use in a mechanical filter.

Still another feature of the invention is to provide a mechanical bandpass filter employing a third-mode torsional electromechanical resonator.

Yet another feature of the invention is to provide a mechanical bandpass filter having improved spurious rejection employing a third-mode torsional electromechanical resonator.

Still a further feature of the invention is to provide a third-mode torsional electromechanical resonator having rugged construction for use in mechanical filters.

Yet a further feature of the invention is to provide a third-mode torsional electromechanical resonator which may be used as an input and output to couple signals to second-mode interior mechanical resonators in a mechanical bandpass filter.

These and other advantages and novel features of the invention will become apparent from the following detailed description when considered in connection with the accompanying drawings wherein:

BRIEF DESCRIPTION OF THE DRAWINGS

FIG. 6 is a perspective view of an arrangement of third-mode torsional electromechanical resonators coupled with second-mode torsional interior resonators to

DETAILED DESCRIPTION OF PREFERRED EMBODIMENTS

Figure 1:
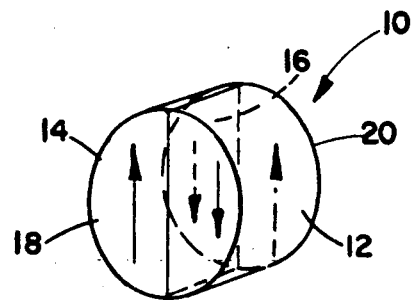
FIG. 1 is a perspective view showing the construction of a conventional ceramic transducer.

Referring now to the drawings, wherein like numerals are used to refer to like elements throughout, there are shown schematic diagrams of the elements and various structures which form torsional electromechanical resonators. More particularly, in FIG. 1, there is shown a ceramic disc 10 which is used as a transducer for constructing a torsional electromechanical resonator. The disc 10 may be a commercially purchased piezoelectric ceramic disc formed from two semicylindrical piezoelectric ceramic portions 12 and 14 which are polarized in opposite directions (shown by the arrows) parallel to the length of the rectangular surface forming the boundary attachment surface 16 between the portions 12 and 14. By way of example, the portions 12 and 14 may be epoxied along the surface 16 to form the disc 10 and coated over surfaces 18 and 20 with a conductor such as gold to form electrodes with readily solderable surfaces. Thereafter, a voltage applied across the conductive coatings forming the electrodes on surfaces 18 and 20, cause the surfaces to move in the direction of the arrows or in the opposite direction if the voltage of opposite polarity is applied.

Figure 2:
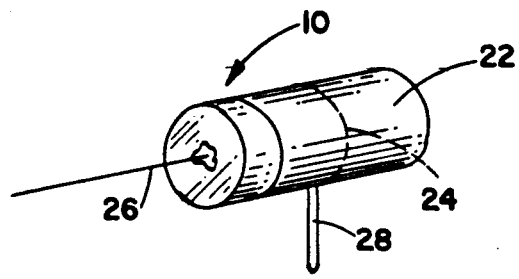
FIGS. 2 and 3 are examples of conventional single mode torsional electromechanical resonators constructed using conventional ceramic discs.

In the prior art, there are two exemplary single mode torsional electromechanical resonators that have been formed using the ceramic disc transducer 10. In FIG. 2, one such resonator is shown that includes a conventional cylindrical resonator rod 22 and a ceramic disc 10 coaxially attached to one end of the resonator rod 22. A thin lead wire 26 is attached, for example, by soldering to one of the conductive surfaces of the ceramic disc 10 to provide the signal input while a support pin 28 is welded to the resonator rod 22 at the node 24 to provide the ground reference and physically support the resonator.

Figure 3:
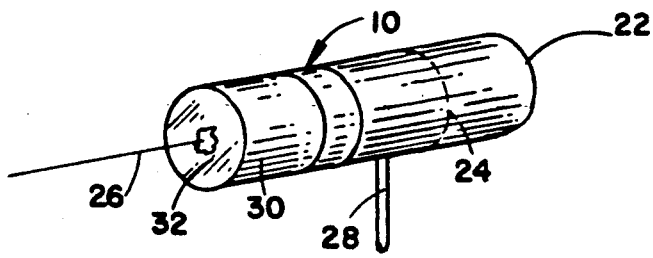

In a second configuration shown in FIG. 3, a second resonator rod 30 is attached to the exposed face of the ceramic transducer 10 and the thin lead wire 26 is attached by soldering to an exposed face 32 of resonator rod. The resonator rod 30, ceramic disc 10 and resonator rod 22 are coaxially aligned and attached to form the configuration shown. In this instance, the resonator rod 30 has a length selected such that its length plus the length of the ceramic transducer 10 is less than the total length of the resonator rod 22. This allows the ceramic transducer to be positioned close to node 24 to provide greater electromechanical coupling while still allowing the support pin 28 to be attached to the node 24 on the rod 22.

In both configurations shown by FIGS. 2 and 3, the ground support 28 is located at the node 24 and is used as the electrical ground and physical support for the resonator rod while the electrical input signal is supplied by the thin wire 26. In both instances, the attachment of the thin lead wire 26 to the ceramic disc or rod requires intensive labor. Furthermore, the soldering attachment produces variations in the effective mass of the lead wire and solder that may produce frequency variations and prevent consistent resonator construction.

Figure 4:
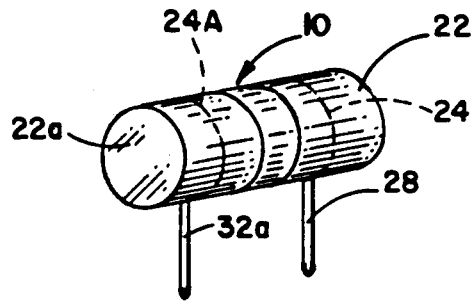
FIG. 4 is a perspective view showing a conventional second-mode torsional electromechanical resonator using a conventional ceramic disc.

In FIG. 4, there is shown a second-mode torsional resonator which is constructed using cylindrical resonator rods 22 and 22a of substantially identical configuration and length coaxially attached to a ceramic disc transducer 10 so that ceramic disc 10 is sandwiched between adjacent opposed ends of resonator rods 22 and 22a. In this configuration, the strength of the resonator is improved by providing a second support pin attachment 32a at the second node 24a. The support pin 32a provides the signal input in lieu of the lead wire 26 referenced with respect to FIGS. 2 and 3. This eliminates the need for the expensive lead wire attachment previously mentioned and produces second-mode torsional electromechanical resonators with a support similar to that used in second-mode interior resonators conventionally used as the interior torsional resonators in mechanical filters.

However, such second mode configurations do not provide sufficient coupling for many mechanical bandpass filter designs. Specifically, for maximum coupling the ceramic transducer must be located at the place where maximum stress occurs. In a torsional resonator (twisting bar) this is where the sections of the bar twisting in opposite directions meet to produce a node. In the second-mode resonator, these points are already used to support the rod and the transducer must be positioned away from the node, thereby limiting the configuration of the torsional electromechanical resonator. Furthermore, in a second-mode torsional electromechanical resonator, the spurious mode frequencies will be near those of the second-mode torsional interior resonators because of the similar lengths of the resonators, thereby allowing spurious frequencies to pass through the filter and resulting in poor spurious rejection of the bandpass filter.

Figure 5:
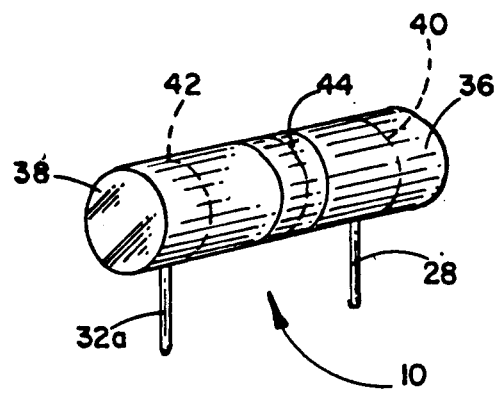
FIG. 5 is a perspective view showing a third-mode torsional electromechanical resonator constructed in accordance with the present invention.

Referring now the FIG. 5, there is shown a third-mode torsional electromechanical resonator constructed in accordance with the present invention. In this instance, two resonator rods 36 and 38 are attached coaxially to a ceramic transducer 10. The lengths of the resonator rods 36 and 38 are fixed so that the electromechanical resonator resonates at the desired frequency in the third torsional mode, which has three nodes at 40, 42, and 44. Nodes 40 and 42 in the resonator rods 36 and 38 have support wires 28 and 32a supporting the electromechanical resonator at the nodes. The signal input is provided at 32a and ground at 28. The third node is formed at a point along the length of the cylindrical surface of the electromechanical resonator defined by a plane substantially bisecting the length of the electromechanical resonator and parallel to the surfaces 18 and 20 of the transducer 10.

The length of the third-mode torsional electromechanical resonator is significantly greater than the length of a second-mode torsional interior resonator. Accordingly, when the third-mode torsional electromechanical resonators of the present invention are used as input and output transducers for a mechanical filter which uses second-mode interior resonators, there is substantial rejection of spurious modes. The characteristics of the filter producing such spurious rejection are therefore far superior to the prior art configurations.

As will be appreciated from reference to FIG. 5, third-mode torsional electromechanical resonator configurations provide additional advantages in allowing sufficient latitude for achieving various electromechanical couplings. Specifically, the length of the resonator rods 36 and 38 can be constructed in such a way that the ceramic transducer 10 is positioned for minimum coupling (where the transducer is centered between two of the nodes) to a maximum coupling (where the transducer is centered on the center node as shown in FIG.

5). This allows a bandpass filter to be constructed with proper electromechanical coupling for a variety of mechanical bandpass filter bandwidths.

In addition to the above, there is no need for lead wires as shown in FIGS. 2 and 3. Rather, the more rugged support pin construction centered on nodes 40 and 42 is used to produce improved construction.

Figure 6:
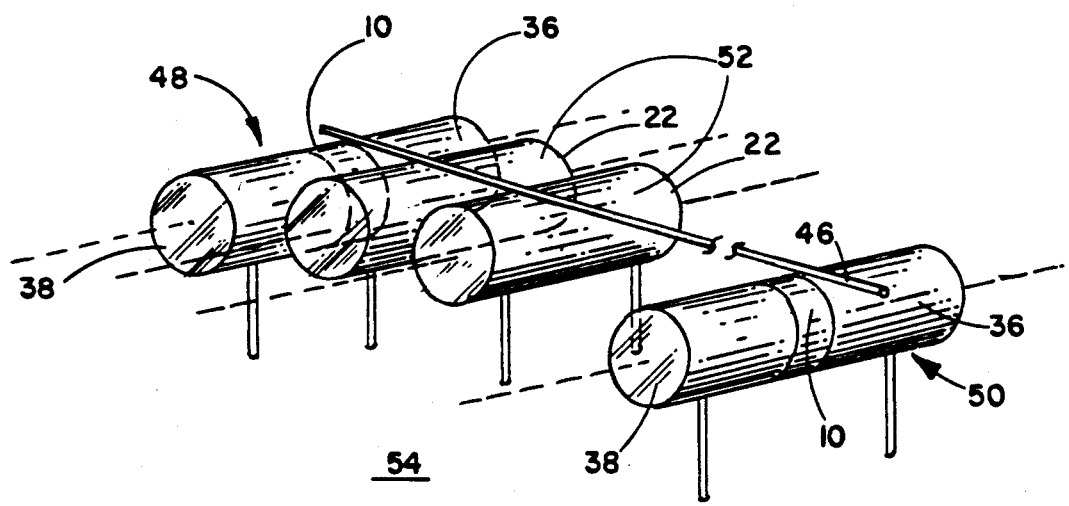

Referring now to FIG. 6, there is shown an exemplary embodiment of a mechanical filter arrangement using third-mode torsional electromechanical resonators and second-mode torsional interior resonators. In this example, two third-mode torsional electromechanical resonators 48 and 50 are used as the input and output respectively of the filter arrangement 54. The resonators 48 and 50 are coupled in a parallel arrangement with interior second-mode torsional resonators 52 by a coupling wire 46. In this instance, electrical energy provided to the third-mode torsional electromechanical resonator 48 is converted to mechanical energy and acoustically coupled through the interior second-mode torsional resonators 52, to the third-mode torsional electromechanical resonator 50 which converts the transmitted mechanical energy back to an electrical signal completing the bandpass filter 54.

As will be appreciated from the above description, the third-mode torsional electromechanical resonators of the present invention provide an improved construction which enables the formation of a mechanical filter having good spurious rejection. The particular configuration forming the three nodes provides improved electromechanical coupling while still producing a rugged support configuration. When coupled in combination with second-mode torsional interior resonators, the resulting mechanical bandpass filter has improved spurious rejection. All of these are features and advantages which are not shown or recognized by the prior art.

Obviously, many other modifications and variations are possible in light of the above teachings. It is therefore to be understood that within the scope of the appended claims, the invention may be practiced otherwise then as specifically described.

I claim:

1. A bandpass filter comprising:
  an input resonator formed as a first third-mode torsional electromechanical resonator coupled to receive an electrical input signal;
  at least one second-mode torsional interior resonator coupled in spaced relationship to said input resonator; and
  an output resonator formed as a second third-mode torsional electromechanical resonator coupled in spaced relationship to said at least one second-mode torsional interior resonator so that said at least one second-mode torsional interior resonator is physically positioned between said input resonator and said output resonator.

2. The filter of claim 1 wherein said at least one second-mode torsional interior resonator is a plurality of second-mode torsional interior resonators each having an axis and each spaced adjacent one another and having an axis parallel to the next adjacent second-mode interior resonator and lying in the same plane.

3. The filter of claim 1 wherein said input and output third-mode torsional electromechanical resonators comprise:
  a first torsional resonator rod having an axis;
  a transducer having opposed surfaces each defining an electrode constructed such that a voltage applied across the opposed electrodes produces a torsional force on the surfaces of said transducer, said transducer having an axis and having one of said electrodes coupled to one end of said first torsional resonator rod and coaxial therewith;
  a second torsional resonator rod having an axis and having one end coupled to the other of said electrodes of said transducer coaxial with the axis of the first torsional resonator rod, said first and second torsional resonator rods and said transducer being constructed and arranged such that said rods form first and second nodes and said transducer is positioned between said first and said second rods forming a third node; and
  a first support lead coupled to said first torsional resonator rod beneath said first node as a signal input and a second support lead coupled to said second torsional resonator rod beneath said second node as a ground lead.

4. The filter of claim 3 wherein said first and second torsional resonator rods are cylindrical.

5. The filter of claim 3 wherein said first and second torsional resonator rods and said transducer are cylinders and are coaxially aligned along a common axis.

6. The filter of claim 3 wherein said transducer is a piezoelectric ceramic disc.

* * * * *

UNITED STATES PATENT AND TRADEMARK OFFICE
CERTIFICATE OF CORRECTION

PATENT NO. : 5,006,824
DATED : April 9, 1991
INVENTOR(S) : Aaron R. Paff

It is certified that error appears in the above-identified patent and that said Letters Patent is hereby corrected as shown below:

On the title page item [54]:

change "F-M" to --E-M--.

Signed and Sealed this

Fifteenth Day of September, 1992

Attest:

DOUGLAS B. COMER

Attesting Officer

Acting Commissioner of Patents and Trademarks